(12) United States Patent
Murofushi et al.

(10) Patent No.: US 7,566,576 B2
(45) Date of Patent: Jul. 28, 2009

(54) GALLIUM-CONTAINING LIGHT-EMITTING SEMICONDUCTOR DEVICE AND METHOD OF FABRICATION

(75) Inventors: Hitoshi Murofushi, Saitama (JP); Shiro Takeda, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/049,614

(22) Filed: Mar. 17, 2008

(65) Prior Publication Data

US 2008/0166828 A1   Jul. 10, 2008

Related U.S. Application Data

(62) Division of application No. 11/135,236, filed on May 23, 2005, now abandoned.

(30) Foreign Application Priority Data

Nov. 29, 2002   (JP)   ............................ 2002-348416
Nov. 21, 2003   (JP)   ................ PCT/JP2003/014890

(51) Int. Cl.
    *H01L 21/00* (2006.01)
(52) U.S. Cl. .......................................... 438/29; 438/69
(58) Field of Classification Search .................. 438/22, 438/29, 69; 257/98, 99
    See application file for complete search history.

(56) References Cited

U.S. PATENT DOCUMENTS 3,861,024 A   1/1975   Napoli et al.
6,222,207 B1   4/2001   Carter-Coman et al.
6,869,820 B2   3/2005   Chen

FOREIGN PATENT DOCUMENTS

| JP | 49-40863 0 | 4/1974 |
|---|---|---|
| JP | 05-251739 | 9/1993 |
| JP | 2001-339100 | 12/2001 |
| JP | 2002-217450 | 8/2002 |
| JP | 2002-261044 | 9/2002 |

OTHER PUBLICATIONS

Sheu, J.K. et al., "The Effect of Thermal Annealing on the Ni/Au Contact of p-type GaN", Journal of Applied Physics, Mar. 15, 1998, 83(6), 3172-3715.

*Primary Examiner*—Thien F Tran
(74) *Attorney, Agent, or Firm*—Woodcock Washburn LLP

(57) ABSTRACT

An LED comprising a light-generating semiconductor region having an active layer sandwiched between two confining layers of opposite conductivity types. A cathode is arranged centrally on one of the opposite major surfaces of the semiconductor region from which is emitted the light. An array of discrete gold regions are formed via transition metal regions on the other major surface of the semiconductor region at which is exposed one of the confining layers which is of n-type AlGaInP semiconductor material. The gold is thermally diffused into the confining layer via the transition metal regions at a temperature less than the eutectic point of gold and gallium, thereby creating an array of ohmic contact regions of alloyed or intermingled gold and gallium, which are less absorptive of light than their conventional counterparts, to a thickness of 20 to 1000 angstroms. After removing the transition metal regions and gold regions from the surface of the light-generating semiconductor region, a reflective layer of aluminum is formed so as to cover both the ohmic contact regions and the exposed surface portions of the AlGaInP confining layer. An electroconductive baseplate of doped silicon is then bonded to the reflective layer.

14 Claims, 4 Drawing Sheets

GALLIUM-CONTAINING LIGHT-EMITTING SEMICONDUCTOR DEVICE AND METHOD OF FABRICATION

CROSS REFERENCE TO RELATED APPLICATIONS

This application is a divisional of U.S. patent application Ser. No. 11/135,236 filed May 23, 2005, which is a continuation of Application PCT/JP2003/014890, filed Nov. 21, 2003, which claims priority to Japanese Patent Application No. 2002-348416 filed Nov. 29, 2002, the entire contents of which are hereby incorporated by reference.

BACKGROUND OF THE INVENTION

This invention relates to a light-emitting semiconductor device, or light-emitting diode (LED) according to more common parlance, and more particularly to such devices employing gallium-containing compound semiconductors. The invention also concerns a method of making such light-emitting semiconductor devices.

The LED has been known which has a light-generating semiconductor region grown on a substrate of electrically conducting material such as gallium arsenide. Typically, the light-generating semiconductor region has an active layer sandwiched between an n-type cladding or lower confining layer, which overlies the substrate, and a p-type cladding or upper confining layer. An anode is mounted centrally atop the upper confining layer whereas a cathode underlies the substrate. The light generated at the active layer partly traverses directly through the upper confining layer and issues from that part of the surface of the semiconductor region which is left uncovered by the anode. The rest of the light is radiated toward the substrate via the lower confining layer. How to reflect this light most effectively back toward the light-emitting surface of the semiconductor region is of critical importance for the highest possible efficiency of the LED.

One conventional solution to this problem is a reflective film known as the Bragg reflector interposed between the substrate and the light-generating semiconductor region. The Bragg reflector is easy to fabricate by epitaxial growth, the method adopted for subsequent formation of the semiconductor region. Offsetting this advantage is the lack of sufficient reflectivity with respect to the light having a wide spectrum of wavelengths.

Another prior art method calls for the removal of the gallium arsenide substrate following the epitaxial growth of the semiconductor region thereon. A transparent baseplate is then bonded to the semiconductor region in place of the substrate that has been removed, by way of a mechanical support for the LED. Then a reflective electrode is attached to the transparent baseplate. The reflective electrode serves not only as electrode but to reflect the light back through the transparent baseplate toward the light-emitting surface of the semiconductor region. This known remedy is objectionable for a relatively high forward voltage required between anode and cathode as a result of additional resistance at the interface between light-generating semiconductor region and transparent baseplate.

Japanese Unexamined Patent Publication No. 2002-217450, filed by the assignee of the instant application, represents an improvement over the more conventional devices listed above. It teaches the creation of isolated ohmic contact regions of gold-germanium-gallium alloy on the underside of the light-generating semiconductor region. These ohmic contact regions, as well as the surface of the semiconductor region left uncovered thereby, are covered by a reflective layer of aluminum or other metal. An electroconductive baseplate is bonded to the underside of the reflective layer. Making good ohmic contact with the light-generating semiconductor region of, say, aluminum gallium indium phosphide, the ohmic contact regions of gold-germanium-gallium alloy serve for reduction of the forward voltage of the LED.

The last cited prior art LED proved to possess its own weaknesses, however. The gold-germanium-gallium ohmic contact regions were rather inconveniently absorptive of light by reasons of their germanium content and thickness in particular. The total reflectivity of the ohmic contact regions and reflective layer was therefore as low as 30 percent or thereabouts, making it difficult for the LED to gain sufficiently high efficiency. Another shortcoming concerned the morphology of the gold-germanium-gallium ohmic contact regions: Their surfaces were so uneven that difficulties were experienced in bonding the electroconductive baseplate thereto via the reflective layer.

SUMMARY OF THE INVENTION

The present invention has it as an object to further enhance the efficiency of the light-emitting semiconductor device of the kind incorporating the gold-germanium-gallium ohmic contact regions, or, for a given intensity of light produced, to make the forward voltage of the device lower than hitherto.

Briefly stated in one aspect thereof, the invention concerns a light-emitting semiconductor device of improved efficiency comprising a light-generating semiconductor region having a first major surface from which light is emitted and a second major surface which is opposite to the first major surface. The light-generating semiconductor region is constituted of a plurality of compound semiconductor layers in lamination including a gallium-containing compound semiconductor layer which is exposed at the second major surface of the semiconductor region. The invention particularly features an ohmic contact region held in ohmic contact with at least part of the second major surface of the light-generating semiconductor region. The ohmic contact region is made from a mixture of at least two metals including gallium and is pervious to the light generated by the light-generating semiconductor region. Also included is a reflective layer of electrically conducting material held against at least either of the ohmic contact region and that part, if any, of the gallium-containing compound semiconductor layer of the light-generating semiconductor region which is exposed at the second major surface of the semiconductor region through the ohmic contact region, for reflecting the light from the semiconductor region back toward the semiconductor region for emission from the first major surface thereof.

Preferably, the gallium-containing compound semiconductor layer of the light-generating semiconductor region is made from one of the following three compound semiconductors and a conductivity-type determinant:

(a) a first compound semiconductor that is generally expressed as $Al_xGa_yIn_{1-x-y}P$ where the subscript x is a numeral that is equal to or greater than zero and less than one; the subscript y is a numeral that is greater than zero and equal to or less than one; and the sum of x and y is greater than zero and equal to or less than one;

(b) a second compound semiconductor that is generally expressed as $Al_xGa_yIn_{1-x-y}As$ where the subscript x is a numeral that is equal to or greater than zero and less than one; the subscript y is a numeral that is greater than zero and equal to or less than one; and the sum of x and y is greater than zero and equal to or less than one; and (c) a third compound semiconductor that is generally expressed as $Al_xGa_yIn_{1-x-y}N$ where the subscript x is a numeral that is equal to or greater than zero and less than one; the subscript y is a numeral that is greater than zero and equal to or less than one; and the sum of x and y is greater than zero and equal to or less than one.

Preferably, the ohmic contact region is made, by the method of this invention to be summarized subsequently, from a mixture or alloy of gallium and gold to a thickness of from about 20 to about 1000 angstroms. Further the ohmic contact region is divided into an array of discrete regions, which are embedded in the second major surface of the light-generating semiconductor region. Thus the discrete ohmic contact regions substantially "cover" parts of the second major surface of the light-generating semiconductor region and leave the rest of the surface exposed. The reflective layer is held against both the ohmic contact regions and the exposed part of the second major surface of the light-generating semiconductor region. The reflective layer may be made from aluminum or like metal for higher reflectivity than the ohmic contact regions.

Made from a mixture or alloy of gallium and gold in particular, the ohmic contact regions according to the invention are far less absorptive of light than the prior art gold-germanium-gallium ohmic contact regions. The less absorptive ohmic contact regions permit, of course, a correspondingly higher percentage of the light from the light-generating semiconductor region to pass therethrough for reflection by the reflective layer back toward the light-emitting first major surface of the semiconductor region. Thus, for a given voltage applied, the device will emit light of greater intensity than heretofore.

Conversely, for a given output light intensity, the ohmic contact region or regions may be greater in surface area with respect to the area of the second major surface of the semiconductor region, to an extent corresponding to the increased amount of light reflected back through the ohmic contact regions. That is to say that the same output light intensity is obtainable if the ohmic contact region or regions are made greater than hitherto. Such larger ohmic contact region or regions lead to less resistance to current flow through the device, to less forward voltage, to less power loss, and hence to higher efficiency of light production.

It is also recommended that the ohmic contact region or regions be made as aforesaid from about 20 to about 1000 angstroms in thickness. Made so thin, the ohmic contact region or regions will absorb even less light and permit an even higher proportion of the incoming light to be reflected back toward the light-emitting surface of the device.

Another aspect of the invention pertains to a method of making the light-emitting semiconductor device of the above summarized construction, with a particular emphasis on how to create the ohmic contact region or regions. There is first prepared the light-generating semiconductor region including the gallium-containing compound semiconductor layer which is exposed at the second major surface of the semiconductor region. By way of preparation for creation of the ohmic contact region or regions in this second major surface of the semiconductor region, a transition metal layer is formed on at least part or parts of the second major surface. Then, on this transition metal layer, a diffusible metal layer is formed which contains a metal, preferably gold, that can be thermally diffused into the gallium-containing compound semiconductor layer of the light-generating semiconductor region through the transition metal layer. The desired ohmic contact region or regions are created in the gallium-containing compound semiconductor layer of the light-generating semiconductor region by the thermal diffusion of gold or the like as the article is subsequently heated to a temperature less than the eutectic point of the metals concerned, which are gallium and gold in the illustrated embodiments. Then the transition metal layer and diffusible metal layer are both removed from the light-generating semiconductor region. Then the reflective layer is created on at least either of the ohmic contact region or regions and that part, if any, of the gallium-containing compound semiconductor layer of the light-generating semiconductor region which is exposed at the second major surface of the semiconductor region through the ohmic contact region or regions.

Particular attention may be paid to the transition metal layer through which gold is diffused into the gallium-containing compound semiconductor layer of the light-generating semiconductor region. The transition metal is capable both of solid-phase decomposition of the compound semiconductor into the individual elements and of cleansing the semiconductor surface. These inherent capabilities of the transition metal enable solid-phase gold diffusion into the gallium-containing compound semiconductor layer at a temperature as low as below the eutectic point of gallium and gold. Formed in this manner by low-temperature solid-phase diffusion, the ohmic contact region or regions are of minimal thickness and are highly favorable in surface morphology, besides being free from germanium or other metal that interferes with the passage of light therethrough.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION OF THE INVENTION

Figure 1:
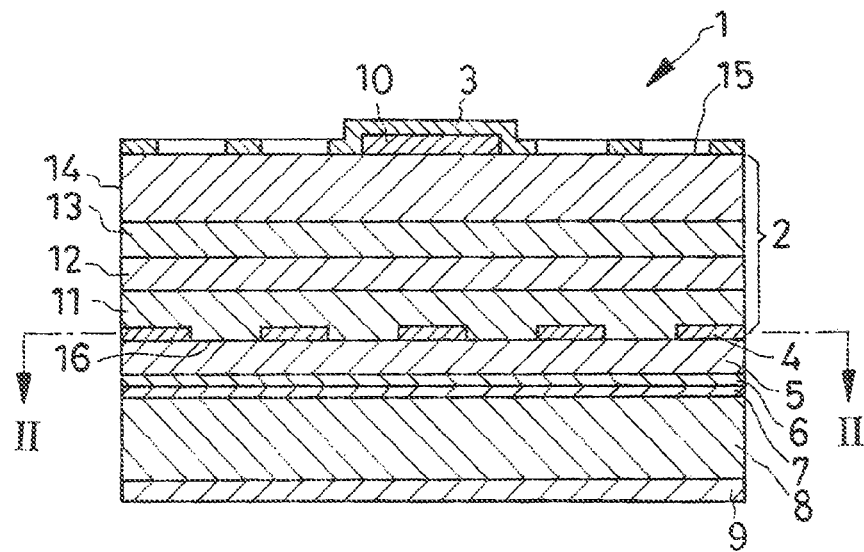
FIG. 1 is a cross section through an LED embodying the principles of this invention.
Figure 2:
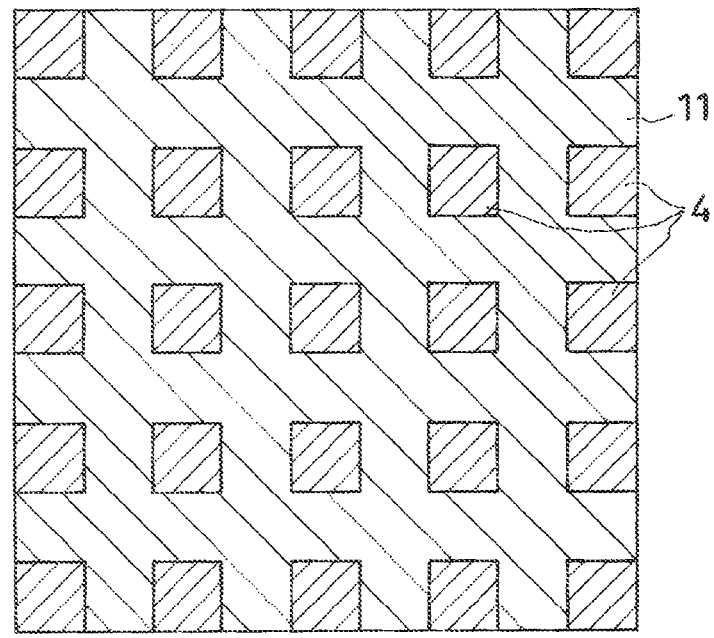
FIG. 2 is a transverse section through the LED, taken along the line II-II in FIG. 1.

The present invention is believed to be best embodied in the LED shown completed in FIGS. 1 and 2 and in successive states of fabrication in FIGS. 3-8. Generally designated 1 in FIG. 1, the representative LED broadly comprises:

1. A light-generating semiconductor region 2 where light is produced and which is constituted of several layers in lamination to be set forth shortly.

2. An anode 3 of open-worked or meshed design on a first 15 of the pair of opposite major surfaces of the semiconductor region 2, the first major surface 15 being hereinafter referred to as the top surface of the semiconductor region.

3. An array of isolated ohmic contact regions 4, to which the present invention is specifically directed, on the other major surface 16, hereinafter referred to as the bottom surface, of the semiconductor region 2.

4. A reflective layer 5 covering the whole array of ohmic contact regions 4 as well as that part of the bottom surface of the semiconductor region 2 which is left exposed through the ohmic contact regions.

5. An electroconductive silicon baseplate 8 joined to the underside of the reflective layer 5 via bonding metal layers 6 and 7.

6. A cathode 9 underlying the electroconductive silicon baseplate 8.

7. A current blocking layer 10 formed centrally on the top surface of the semiconductor region 2 in underlying relationship to part of the anode 3.

The light-generating semiconductor region 2 as the semiconductor body is shown as a lamination of an n-type semiconductor lower confining layer or cladding 11, an active layer 12, a p-type semiconductor upper confining layer or cladding 13, and a current spreading layer 14 of a p-type compound semiconductor, all grown by epitaxy in that order on a substrate, not shown, of any known or suitable composition. The substrate for growing the layers 11-14 of the light-generating semiconductor region 2 is not shown because it is removed following the fabrication of all these layers and is absent from the completed LED 1. The current spreading layer 14 provides the above defined top surface 15 of the semiconductor region 2 whereas the n-type lower cladding 11 provides the bottom surface 16 of the semiconductor region. Generated in the active layer 12, the light traverses the upper cladding 13 and current spreading layer 14 and issues from the top surface 15 of the semiconductor region 2.

The n-type lower cladding 11 of the light-generating semiconductor region 2 is made from, in addition to an n-type dopant such as silicon, any of gallium-containing III-V compound semiconductors that are generally defined as:

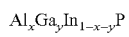

where the subscript x is a numeral that is equal to or greater than zero and less than one; the subscript y is a numeral that is greater than zero and equal to or less than one; and the sum of x and y is greater than zero and equal to or less than one. Preferably, the aluminum proportion x is from about 0.15 to about 0.45, and most desirably from about 0.2 to about 0.4. The gallium proportion y is preferably from about 0.15 to about 0.35, and most desirably from about 0.4 to about 0.6. The n-type impurity may be added to this lower cladding 11 to the concentration of $5 \times 10^{17}$ cm$^{-3}$ or more. The gallium content of this lower cladding 11 is conducive to the formation of the ohmic contact regions 4 of alloyed or intermingled gallium and gold, as will be later explained in more detail. As is well known, the lower cladding 11 has a greater bandgap than does the active layer 12.

As required or desired, an n-type contact layer of Groups III-V compound semiconductor material might be formed under the n-type lower cladding. The semiconductor materials for this n-type contact layer can also be expressed as $Al_xGa_yIn_{1-x-y}P$.

The active layer 12 of the light-generating semiconductor region 2 is made from any of p-type Group III-V compound semiconductors that are generally defined as:

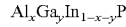

where the subscripts x and y are both numerals that are equal to or greater than zero and equal to or less than one, and the sum of x and y is equal to or greater than zero and equal to or less than one. Preferably, the aluminum proportion x is not less than about 0.1.

No conductivity determinant is added to the active layer 12 in this embodiment of the invention. In practice, however, the active layer 12 may be doped with a p-type determinant to a concentration less than that of the p-type upper cladding 13, or with an n-type determinant to a concentration less than that of the n-type lower cladding 11. The showing of the single active layer 12 in FIG. 1 is for the sake of simplicity only; in practice, it may take the form of either multiple or single quantum well configuration which is per se well known in the art.

The p-type upper cladding 13 overlying the active layer 12 may be fabricated from any of the p-type Group III-V compound semiconductors that are generally defined as:

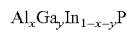

where the subscripts x and y are both numerals that are equal to or greater than zero and equal to or less than one, and the sum of x and y is equal to or greater than zero and equal to or less than one. Preferably, the aluminum proportion x of the upper cladding 13 is from about 0.15 to about 0.45. The p-type impurity (e.g. zinc) of the upper cladding 13 is not less than $5 \times 10^{17}$ cm$^{-3}$. As is well known, the bandgap of this upper cladding 13 is greater than that of the active layer 12.

The current spreading layer 14 on the upper cladding 13 is designed to serve the triple purpose of enhancing uniformity in the distribution of the forward current flowing through the light-generating semiconductor region 2, assuring ohmic contact with the anode 3, and permitting unimpeded passage of the light therethrough for emission from the LED. The current spreading layer 14 can be made from any such p-type Group III-V compound semiconductor as GaP, $Ga_xIn_{1-x}P$, or $Al_xGa_{1-x}As$. The p-type impurity concentration of this current spreading layer 14 is made higher than that of the upper cladding 13. A p-type contact layer could be laid over the current spreading layer 14 for better ohmic contact with the anode 3.

Arranged centrally on the top surface 15 of the semiconductor region 2 in underlying relationship to part of the anode 3, the current blocking layer 10 is made from an electrically insulating material in order to preclude concentrated current flow through the underlying central part of the semiconductor region.

The open-worked anode 3 as the first electrode covers the entire top surface 15 of the semiconductor region 2 as well as the current blocking layer 10 formed thereon, making ohmic contact with the current spreading layer 14. In practice the anode 3 may be a lamination of a chromium and a gold layer. As seen in a direction normal to the top surface 15 of the semiconductor region 2, the anode 3 is meshed or latticed in shape in order to permit emission of the light therethrough and to cause uniform flow of forward current through the entire semiconductor region. A transparent material might be employed for the anode 3.

The ohmic contact regions 11 are made from a mixture of at least two metals including gallium and are pervious to the light generated by the light-generating semiconductor region 2. FIG. 2 better reveals the array of discrete ohmic contact regions 4 embedded in the bottom surface 16 of the semiconductor region 2, or of its n-type lower cladding 11. It is therefore both ohmic contact regions 4 and lower cladding 11 that define the bottom surface 16 of the semiconductor region 2. Made practically solely from a mixture or alloy of gallium and gold to a thickness of approximately 20 to 1000 angstroms, the ohmic contact regions 4 make ohmic contact with both lower cladding 11 and underlying reflective layer 5. The ohmic contact regions 4 would not make proper ohmic contact with the neighboring layers if less than about 20 angstroms thick, and would not be sufficiently pervious to light if more than about 1000 angstroms thick.

Made from a mixture of gold and gallium, the ohmic contact regions 4 will be less absorptive of light than the prior art gold-germanium-gallium alloy regions on the underside of the light-generating semiconductor region of the LED according to Japanese Unexamined Patent Publication No. 2002-217450, supra. Further, if made from an alloy of gold and gallium, the ohmic contact regions 4 are more permeable to light than are the same prior art gold-germanium-gallium alloy regions. These prior art alloy regions contain light-blocking germanium and are as thick as 2000 angstroms or more, blocking or absorbing an inconveniently high proportion of the light impinging thereon. By contrast the ohmic contact regions 4 according to the invention do not contain germanium and are as thin as about 20 to 1000 angstroms, permitting the permeation of a much greater proportion of light.

The reflective layer 5, covering the surfaces of the ohmic contact regions 4 and that of the n-type lower cladding 11 exposed there through, is higher in reflectivity than the ohmic contact regions 4. Part of the light that has been radiated from the active layer 12 toward the bottom surface 16 of the semiconductor region 2 is reflected by the surface of the reflective layer 5 that is exposed through the ohmic contact regions 4, back toward the top surface 15 of the semiconductor region 2. The rest of the light that has been radiated toward the semiconductor region bottom surface 16 is in part reflected by the surfaces of the ohmic contact regions 4 and in part, after traversing these ohmic contact regions, reflected by the underlying surface portions of the reflective layer 5, both again back toward the semiconductor region top surface 15.

In this embodiment of the invention the total reflectivity of the gold-gallium ohmic contact regions 4 and the underlying parts of the reflective layer 5 is approximately 60 percent, which is twice as much as that of the prior art gold-germanium-gallium alloy regions and the underlying parts of the reflective layer.

The reflective layer 5 has the bonding metal layer 6 of gold formed on its complete underside. The other bonding metal layer 7, which also is of gold, is formed on the complete top surface of the electroconductive silicon baseplate 8. This baseplate is bonded to the underside of the reflective layer 5 as the two bonding metal layers 6 and 7 are joined to each other under heat and pressure. Made from silicon doped with impurities, the baseplate 8 serves as a mechanical support of the LED, in addition to as a heat radiator and current path. The baseplate 8 is different from the substrate, not shown, that is used for growing thereon the constituent layers 11-14 of the light-generating semiconductor region 2, as will be better understood from the subsequent disclosure of the method of manufacturing this LED 1.

The cathode 9 as the second electrode is formed on the entire bottom surface of the baseplate 8. This cathode will be unnecessary, however, if a metal-made baseplate is employed in place of the silicon baseplate, as the metal-made baseplate will perform the function of a cathode as well.

Method of Fabrication

Figure 3:
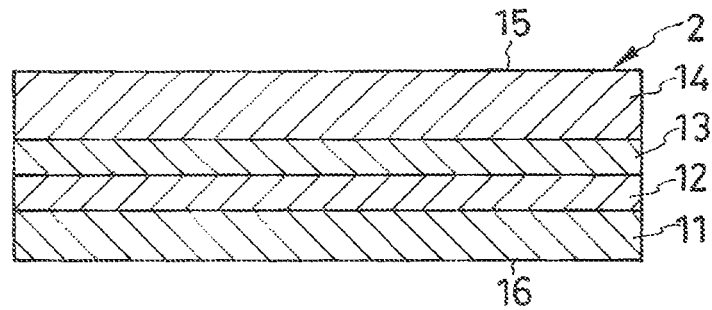
FIG. 3 is a cross section through the light-generating semiconductor region of the LED, shown by way of a first step for fabricating the LED of FIG. 1 by the method of this invention.

The fabrication of the LED 1 shown in FIGS. 1 and 2 started with the preparation of a gallium arsenide substrate, not shown. The semiconductor region 2 was formed on this GaAs substrate by successively growing by metal organic chemical vapor deposition (MOCVD) the n-type lower cladding 11, active layer 12, p-type upper cladding 13, and current spreading layer 14. Then the gallium arsenide substrate was removed from under the completed semiconductor region 2. FIG. 3 shows the thus completed semiconductor region 2.

Then, for creation of the array of isolated ohmic contact regions 4, FIGS. 1 and 2, there were first formed on the entire bottom surface 16 of the semiconductor region 2 a transition metal layer of chromium (Cr) and, thereon, a diffusible meal layer of gold, both by vacuum deposition. Then an etchant-resist mask was laid over the diffusible meal layer and transition metal layer by known photolithography, and these layers were selectively etched away through the etchant-resist mask thereby leaving an array of isolated regions of transition metal layer 17, FIG. 4, and of diffusible metal layer 18 on the now exposed bottom surface 16 of the semiconductor region 2. The transition metal layer 17 could be from about 10 to 500 angstroms thick, and the diffusible metal layer 18 from about 200 to 10,000 angstroms thick.

Speaking more broadly, the transition metal layer could be any of:

1. A layer of at least either of Ti, Ni, Sc, V, Mn, Fe, Co, Cu, Zn, and Be in addition to Cr;

2. A lamination of an Au sublayer, Cr sublayer, and another Au sublayer;

3. A lamination of a Cr sublayer, Ni sublayer, and Au sublayer; and

4. A lamination of a Cr sublayer, AuSi sublayer, and Au sublayer.

Again speaking broadly, the diffusible metal layer could be any of the following in addition to the exemplified layer of gold only:

1. A lamination of an Au sublayer, Cr sublayer, and another Au sublayer;

2. A lamination of a Cr sublayer, Ni sublayer, and Au sublayer; and

3. A lamination of a Cr sublayer, AuSi sublayer, and Au sublayer.

Figure 4:
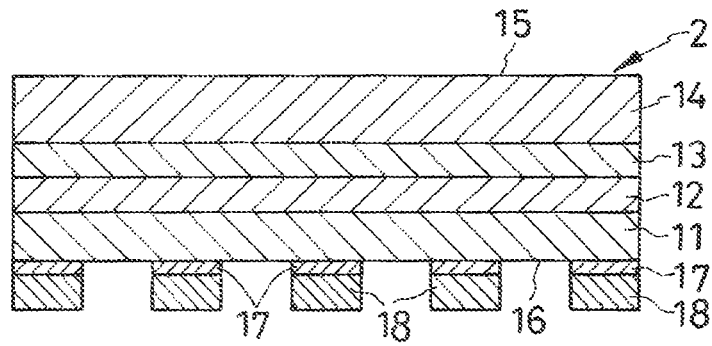
FIG. 4 is a view similar to FIG. 3 but additionally showing a transition metal layer and diffusible metal layer formed in discrete regions on the light-generating semiconductor region.

There is an alternative method of creating the array of isolated regions of transition metal layer 17 and diffusible metal layer 18 as in FIG. 4. The bottom surface 16 of the semiconductor region 2 may first be covered with a mask having an array of windows formed therein. Then the transition metal layer 17 and diffusible metal layer 18 may be formed one after the other by vacuum deposition on the mask as well as on those parts of the semiconductor region bottom surface 16 which are exposed through the windows in the mask. Then the mask may be removed together with the overlying parts of the transition metal layer 17 and diffusible metal layer 18 thereby leaving an array of isolated regions of layers 17 and 18 on the semiconductor region bottom surface 16 as in FIG. 4.

Then the FIG. 4 article was heated to a temperature (e.g. 300° C.) that is lower than the eutectic temperature (345° C.) of gallium in the n-type lower cladding 11 and gold in the diffusible metal regions 18 and at which gold (or some other diffusible metal in cases where such a metal is employed in lieu of gold) can be diffused into the lower cladding with the aid of the transition metal regions 17. The desired ohmic contact regions 4 of a gallium-and-gold mixture were thus created as in FIG. 5 as the gold was diffused into the lower cladding 11 through the transition metal layer 17.

The heat treatment above may be effected at such a temperature, and for such a period of time, that the ohmic contact regions 4 may be formed to a thickness ranging from about 20 to about 1000 angstroms. The temperature in particular may be so determined as to create the ohmic contact regions 4 that are unvarying in thickness and low in resistance and that make good ohmic contact with the lower cladding 11.

Figure 9:
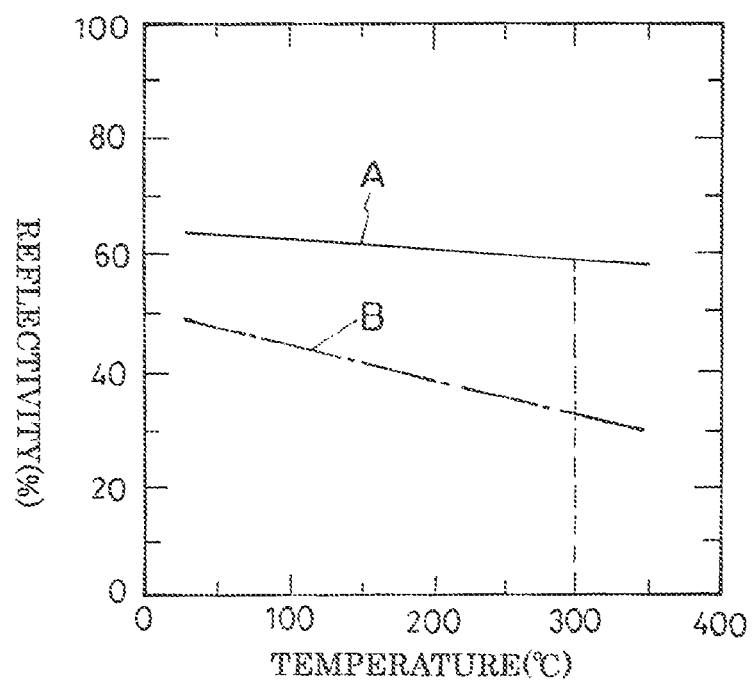
FIG. 9 is a graph plotting the relationship between the reflectivity of the LED according to the invention in comparison with that according to the prior art.

Tests were conducted in order to ascertain the reflectivity of the Au—Ga ohmic contact regions 4 according to the invention in comparison with that of the noted prior art Au—Ge—Ga ohmic contact regions. The curve A in the graph of FIG. 9 plots the total reflectivity of the Au—Ga ohmic contact regions 4 and the underlying parts of the reflective layer 5 according to the invention against the temperature of the heat treatment. The curve B in the same graph plots the total reflectivity of the prior art Au—Ge—Ga ohmic contact relations and the underlying parts of the reflective layer against the temperature of the heat treatment for creation of the ohmic contact regions. The reflectivities were measured for red light with a wavelength of 650 nanometers.

The reflectivity at 300° C. according to the invention is approximately 30 percent, twice as high as that according to the prior art. It will also be observed from this graph that the lower the temperature of the heat treatment, the higher is the reflectivity. But the contact resistance between the ohmic contact regions and the lower cladding 11 grows inconveniently high if the temperature of the heat treatment is too low. The temperature of the heat treatment should therefore be from about 250° to about 340°, preferably from about 290° to about 330° C., in order to keep the contact resistance not more than $2\times10^{-4}$ ohm-cm$^2$.

Figure 5:
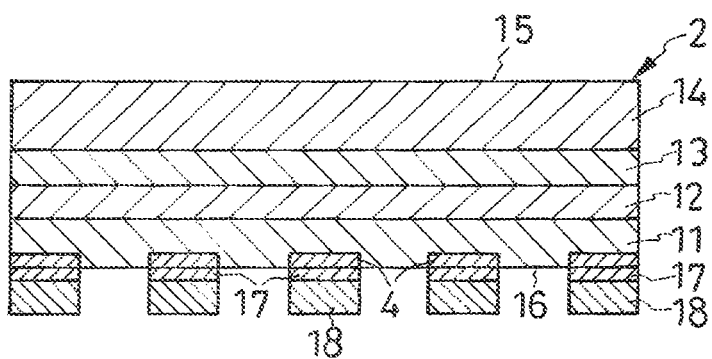
FIG. 5 is a view similar to FIG. 4 but additionally showing the ohmic contact regions formed in the light-generating semiconductor region by thermal diffusion of the diffusible metal through the transition metal layer.

The transition metal regions 17, FIGS. 4 and 5, are effective both to decompose the AlGaInP of the lower cladding 11 into the individual elements, imparting greater mobility thereto, and to cleanse the surface of the lower cladding. These functions of the transition metal regions 17 are conducive to gold diffusion into the lower cladding 11 at a temperature less than the eutectic point of gallium and gold, with the consequent creation of the extremely thin ohmic contact regions 4 of a mixture or alloy of these metals.

Figure 6:
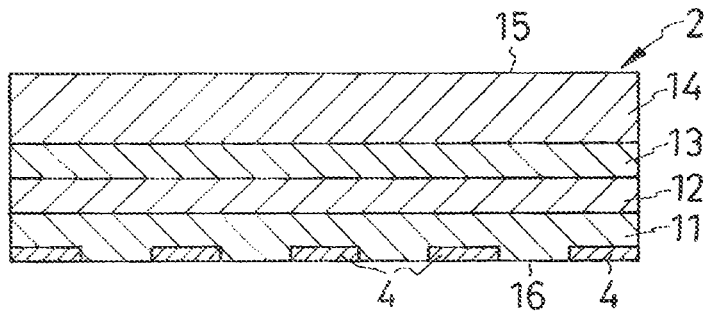
FIG. 6 is a view similar to FIG. 5 except that the transition metal layer and diffusible metal layer of FIGS. 4 and 5 are not shown because they have been removed upon creation of the ohmic contact regions as in FIG. 5.

Then the transition metal regions 17 and diffusible metal regions 18 were etched away, leaving the ohmic contact regions 4 which were embedded in the lower cladding 11. FIG. 6 shows the resulting semiconductor region 2 with the ohmic contact regions 4. Fabricated by the above described method, the Au—Ga ohmic contact regions 4 according to the was far better in surface morphology than the prior art Au—Ge—Ga regions. The bottom surface 16 of the semiconductor region 2, including the exposed surfaces of the ohmic contact regions 4, was therefore flatter than the corresponding surface of the prior art.

Figure 7:
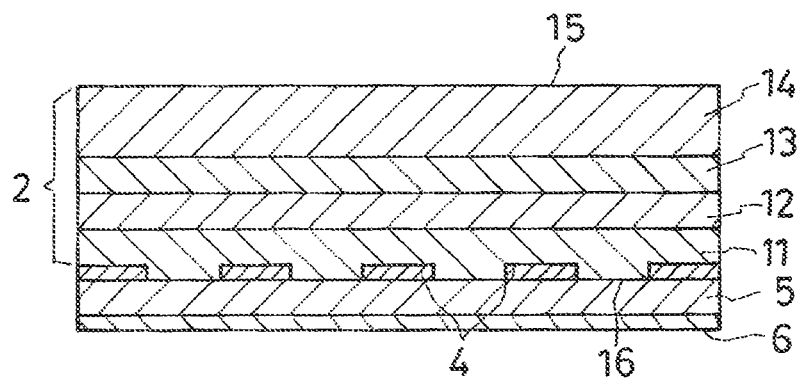
FIG. 7 is a view similar to FIG. 6 but additionally showing the reflective layer subsequently formed on the FIG. 6 article.
Figure 8:
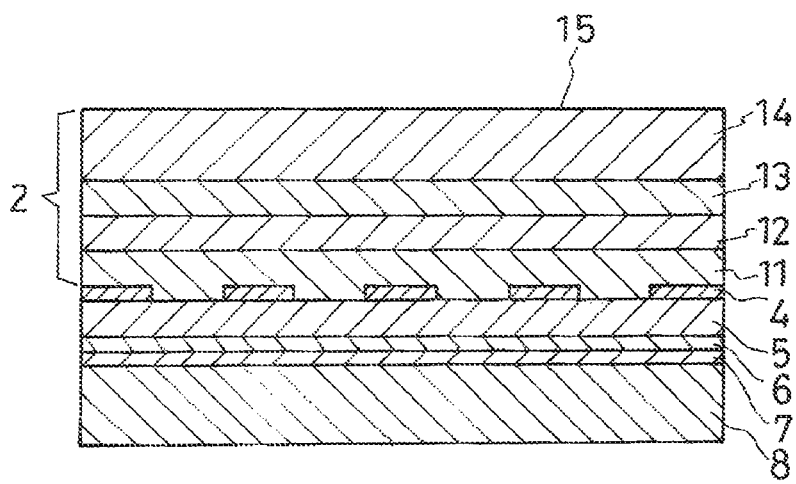
FIG. 8 is a view similar to FIG. 7 but additionally showing the electroconductive silicon baseplate bonded to the FIG. 7 article.

Then, on this bottom surface 16 of the semiconductor region 2, aluminum was vacuum deposited to a thickness of one to 10 micrometers, and the deposit was heated with an infrared lamp, thereby completing the reflective layer 5 shown in FIG. 7. The electroconductive reflective layer 5 makes ohmic contact with the exposed surfaces of the ohmic contact regions 4. Further, as the reflective layer 5 makes Schottky contact with the exposed surface of the lower cladding 11, the forward current of the LED 1 does not flow from the lower cladding to the reflective layer. The reflective layer 5 was highly favorable in flatness thanks to the improved surface morphology of the ohmic contact regions 4.

Then, as shown also in FIG. 7, the bonding metal layer 6 was formed on the surface of the reflective layer 5 by vacuum deposition of gold.

There was separately prepared the baseplate 8 of doped silicon which, as has been stated, is to function as a mechanical support for the other constituent parts of the LED. The bonding metal layer 7 of gold was formed on one of the opposite major surfaces of the baseplate 8 by vacuum deposition. This layer 7 was held under pressure against the bonding metal layer 6 on the underside of the reflective layer 5, and both layers 6 and 7 were heated to a temperature not exceeding 300° C. thereby causing both layers to unite with each other by the mutual welding of gold. The baseplate 8 was thus integrally joined to the reflective layer 5.

Then, referring back to FIG. 1, the current blocking layer 10 and anode 3 were conventionally formed on the top surface 15 of the semiconductor region 2. The cathode 9 was formed on the underside of the baseplate 8. Thus was completed the fabrication of the LED 1.

The advantages gained by this particular embodiment of the invention may be recapitulated as follows:

1. The ohmic contact regions 4 and the underlying parts of the reflective layer 5 are as high in total reflectivity as 60 percent thanks to the absence of light-absorbing germanium from the ohmic contact regions and to their reduced thickness. A much greater proportion than heretofore of the light that has been radiated from the active layer 12 toward the reflective layer 5 is sent back toward the light-emitting surface 15 of the LED, resulting in a significantly higher efficiency of light production per unit of electric power consumed.

2. The ohmic contact regions 4 can be made larger than their conventional counterparts for a given area of the bottom surface 16 of the light-generating semiconductor region 2 and for a given optical output by reason of the improved total reflectivity of the ohmic contact regions and the underlying parts of the reflective layer 5. Such larger ohmic contact regions lead to less forward resistance, less forward voltage drop and power loss, and higher efficiency. The maximum efficiency of the red light emitting diode 1 was 47 lumens per watt at a current density of 40 amperes per square centimeter.

3. The ohmic contact regions 4 of gold and gallium are capable of creation at a temperature less than their eutectic point by thermal diffusion of gold from the diffusible metal regions 18 into the n-type lower cladding 11 via the transition metal regions 17.

4. The electroconductive silicon baseplate 8 can be firmly bonded to the reflective layer 5 by virtue of the improved surface morphology of the ohmic contact regions 4.

Figure 10:
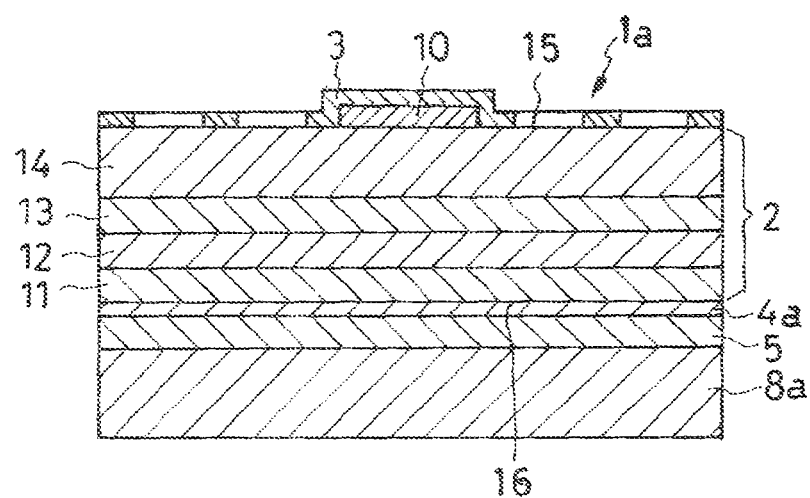
FIG. 10 is a view similar to FIG. 1 but showing an alternate form of LED according to the invention.

Embodiment of FIG. 10

Another preferred form of LED $1_a$ shown in FIG. 1 has an integral ohmic contact region $4_a$ covering the entire bottom surface 16 of the lower cladding 11. A relatively high efficiency is nevertheless obtainable because the total reflectivity of the ohmic contact region $4_a$ and reflective layer 5 is as high as 60 percent. As the ohmic contact region $4_a$ is larger than all the isolated ohmic contact regions 4 of FIGS. 1 and 2 combined, so much is reduced the resistance to forward current flow, with a corresponding diminution of power loss.

Another feature of the alternative LED 1$_a$ resides in a metal-made baseplate 8$_a$ which is affixed to the reflective layer 5 under heat and pressure in place of the silicon baseplate 8 of the previous embodiment. No dedicated cathode is provided as the baseplate 8$_a$ serves as both mechanical support and cathode.

The alternative LED 1 is akin to the first disclosed LED 1 in all the other details of construction. The integrated ohmic contact regions 4$_a$ are created by the same method, and with the same composition and to the same thickness, as their FIGS. 1 and 2 counterpart 4, so that the LED 1$_a$ offers substantially the same advantages as the LED 1.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. The silicon baseplate 8, FIG. 1, and metal-made baseplate 8$_a$, FIG. 10, may both be omitted if the light-generating semiconductor region is sufficiently sturdy and self-supporting. The electroconductive reflective layer 5 will then serve also as cathode, so that the dedicated cathode 9 may also be omitted from the FIG. 1 construction.

2. The ohmic contact regions 4 need not be rectangular as in FIG. 2 but may be circular or otherwise in shape. They need not be separated into discrete units, either, but may be latticed or otherwise joined to one another, besides being wholly combined into a single, closed layer as indicated at 4$_a$ in FIG. 10.

3. An n-type contact layer of AlGaInP and/or n-type buffer layer of AlGaInP could be interposed between the n-type lower cladding 11 and the reflective layer, and the ohmic contact regions 4 or region 4$_a$ could be formed in contact therewith instead of with the lower cladding.

4. The ohmic contact regions 4 or region 4$_a$ may be made from Au—Ge—Ga alloy or some such material other than Au—Ga alloy or mixture, provided that the resulting ohmic contact region or regions are permeable to the light generated by the LED. The total reflectivity of such ohmic contact region or regions and the reflective layer will be raised to a satisfactory level if the thickness of the ohmic contact region or regions are limited to the range of from about 20 to about 1000 angstroms.

5. The diffusible metal regions 18, FIGS. 4 and 5, could be of a gold-based alloy or Ga-based alloy.

6. The reflective layer 5 of the LED 1, FIG. 1, could be provided only under the ohmic contact regions 4 or under the exposed surface portions of the lower cladding 11.

7. The active layer 12 can be made from any such III-V compound semiconductor as $Al_xGa_yIn_{1-x-y}As$ or $Al_xGa_yIn_{1-x-y}N$. Also, the p-type upper cladding 13 can be made from any such III-V compound semiconductor as $Al_xGa_yIn_{1-x-y}As$ or $Al_xGa_yIn_{1-x-y}N$.

What is claimed is:

1. A method of making a light-emitting semiconductor device of improved efficiency, which comprises:
   (a) providing a light-generating semiconductor region having a first major surface from which light is emitted and a second major surface which is opposite to the first major surface, the light-generating semiconductor region comprising a plurality of compound semiconductor layers including a gallium-containing compound semiconductor layer which is exposed at the second major surface of the semiconductor region;
   (b) creating a transition metal layer containing a transition metal on at least part of the second major surface of the light-generating semiconductor region;
   (c) creating a diffusible metal layer on the transition metal layer, the diffusible metal layer containing a metal that can be thermally diffused into the gallium-containing compound semiconductor layer of the light-generating semiconductor region through the transition metal layer;
   (d) creating an ohmic contact region in the gallium-containing compound semiconductor layer of the light-generating semiconductor region by causing thermal diffusion of the diffusible metal from the diffusible metal layer into the gallium-containing compound semiconductor layer through the transition metal layer at a temperature less than the eutectic point of elements constituting the gallium-containing compound semiconductor layer and the diffusible metal;
   (e) removing the transition metal layer and the diffusible metal layer from the light-generating semiconductor region; and
   (f) creating a reflective layer of electrically conducting material on at least either of the ohmic contact region and that part, if any, of the gallium-containing compound semiconductor layer of the light-generating semiconductor region which is exposed at the second major surface of the semiconductor region through the ohmic contact region.

2. A method of making a light-emitting semiconductor device as defined in claim 1, wherein the transition metal layer together with the diffusible metal layer thereon is formed in discrete regions on the second major surface of the light-generating semiconductor region, covering parts, and uncovering the rest, of the second major surface, so that ohmic contact regions are created only in those parts of the gallium-containing compound semiconductor layer of the light-generating semiconductor region which have been covered by the discrete regions of the transition metal layer and the diffusible metal layer.

3. A method of making a light-emitting semiconductor device as defined in claim 2, wherein the reflective layer is created on the complete second major surface of the light-generating semiconductor region.

4. A method of making a light-emitting semiconductor device as defined in claim 1, wherein the gallium-containing compound semiconductor layer of the light-generating semiconductor region is made from one of the following three compound semiconductors and a conductivity-type determinant:
   (a) a first compound semiconductor that is generally expressed as $Al_xGa_yIn_{1-x-y}P$ where the subscript x is a numeral that is equal to or greater than zero and less than one; the subscript y is a numeral that is greater than zero and equal to or less than one; and the sum of x and y is greater than zero and equal to or less than one;
   (b) a second compound semiconductor that is generally expressed as $Al_xGa_yIn_{1-x-y}As$ where the subscript x is a numeral that is equal to or greater than zero and less than one; the subscript y is a numeral that is greater than zero and equal to or less than one; and the sum of x and y is greater than zero and equal to or less than one; and
   (c) a third compound semiconductor that is generally expressed as $Al_xGa_yIn_{1-x-y}N$ where the subscript x is a numeral that is equal to or greater than zero and less than one; the subscript y is a numeral that is greater than zero and equal to or less than one; and the sum of x and y is greater than zero and equal to or less than one.

5. A method of making a light-emitting semiconductor device as defined in claim 1, wherein the gallium-containing compound semiconductor layer of the light-generating semiconductor region is made from a conductivity-type determinant and a compound semiconductor that is generally expressed as $Al_xGa_yIn_{1-x-y}P$ where the subscript x is a numeral that is equal to or greater than 0.4 and less than 1.0; the subscript y is a numeral that is greater than zero and equal to or less than one; and the sum of x and y is greater than zero and equal to or less than one.

6. A method of making a light-emitting semiconductor device as defined in claim 5, wherein the gallium-containing compound semiconductor layer of the light-generating semiconductor region contains the conductivity-type determinant with a concentration of not less than $10^{18}$ $cm^{-3}$.

7. A method of making a light-emitting semiconductor device as defined in claim 1, wherein the transition metal layer is selected from among:
   (a) a layer of at least either of Cr, Ti, Ni, Sc, V, Mn, Fe, Co, Cu, Zn, and Be;
   (b) a lamination of an Au sublayer, Cr sublayer, and another Au sublayer;
   (c) a lamination of a Cr sublayer, Ni sublayer, and Au sublayer; and
   (d) a lamination of a Cr sublayer, AuSi sublayer, and Au sublayer.

8. A method of making a light-emitting semiconductor device as defined in claim 1, wherein the diffusible metal layer is selected from among:
   (a) a gold layer;
   (b) a lamination of an Au sublayer, Cr sublayer, and another Au sublayer;
   (c) a lamination of a Cr sublayer, Ni sublayer, and Au sublayer; and
   (d) a lamination of a Cr sublayer, AuSi sublayer, and Au sublayer.

9. A method of making a light-emitting semiconductor device as defined in claim 1, wherein the diffusible metal is gold, which is so diffused into the gallium-containing compound semiconductor layer of the light-generating semiconductor region that the ohmic contact region created is of an alloy of gallium and gold.

10. A method of making a light-emitting semiconductor device as defined in claim 1, wherein the ohmic contact region is from about 20 to about 1000 angstroms thick.

11. A method of making a light-emitting semiconductor device as defined in claim 1, wherein the reflective layer is made from a metal selected to possess a higher reflectivity than does the ohmic contact region.

12. A method of making a light-emitting semiconductor device as defined in claim 11, wherein the reflective layer is made from aluminum.

13. A method of making a light-emitting semiconductor device as defined in claim 1, which further comprises joining an electroconductive baseplate to the reflective layer.

14. A method of making a light-emitting semiconductor device as defined in claim 13, wherein the electroconductive baseplate is of doped silicon, and wherein the method further comprises joining an electrode to the baseplate.

* * * * *